United States Patent
Li et al.

(10) Patent No.: US 10,637,626 B2
(45) Date of Patent: Apr. 28, 2020

(54) METHOD FOR INDICATING UPLINK SUBFRAME ON UNLICENSED SPECTRUM AND BASE STATION

(71) Applicant: Yulong Computer Telecommunication Scientific (Shenzhen) Co., Ltd., Shenzhen (CN)

(72) Inventors: Mingju Li, Shenzhen (CN); Yajun Zhu, Shenzhen (CN); Yunfei Zhang, Shenzhen (CN)

(73) Assignee: Yulong Computer Telecommunication Scientific (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 16/070,242

(22) PCT Filed: Jul. 30, 2016

(86) PCT No.: PCT/CN2016/092471
§ 371 (c)(1),
(2) Date: Jul. 13, 2018

(87) PCT Pub. No.: WO2017/121097
PCT Pub. Date: Jul. 20, 2017

(65) Prior Publication Data
US 2019/0044670 A1    Feb. 7, 2019

(30) Foreign Application Priority Data
Jan. 15, 2016    (CN) .......................... 2016 1 0032198

(51) Int. Cl.
H04L 5/00    (2006.01)
H04W 28/26    (2009.01)
(Continued)

(52) U.S. Cl.
CPC ............ *H04L 5/005* (2013.01); *H03M 13/09* (2013.01); *H04L 5/0044* (2013.01);
(Continued)

(58) Field of Classification Search
None
See application file for complete search history.

(56) References Cited

U.S. PATENT DOCUMENTS

2014/0086126 A1*    3/2014    Park ................... H04W 52/0206
                                                          370/311
2014/0334355 A1*    11/2014    Ekpenyong ............... H04B 1/56
                                                          370/280
(Continued)

FOREIGN PATENT DOCUMENTS

CN    101277529 A    10/2008
CN    103249153 A    8/2013
(Continued)

OTHER PUBLICATIONS

International Search Report for International Application No. PCT/CN2016/092471, dated Oct. 28, 2016.
(Continued)

*Primary Examiner* — Ayaz R Sheikh
*Assistant Examiner* — Faiyazkhan Ghafoerkhan
(74) *Attorney, Agent, or Firm* — Wolf, Greenfield & Sacks, P.C.

(57) ABSTRACT

Provided is a method for indicating an uplink subframe on an unlicensed spectrum, including: determining a current indication period and a next indication period according to a preset period duration; acquiring an indication position preset in the current indication period, where the indication position is a timing position of one or more preset downlink subframes; and when the indication position in the current indication period arrives, transmitting indication signaling in
(Continued)

Determining a current indication period and a next indication period according to a preset period duration — S110

Acquiring an indication position preset in the current indication period, where the indication position is a timing position of one or more preset downlink subframes — S120

When the indication position in the current indication period arrives, transmitting indication signaling in a downlink subframe corresponding to the indication position — S130 a downlink subframe corresponding to the indication position.

17 Claims, 4 Drawing Sheets

(51) Int. Cl.
*H04W 74/00* (2009.01)
*H04W 76/11* (2018.01)
*H03M 13/09* (2006.01)
*H04W 72/04* (2009.01)

(52) U.S. Cl.
CPC ......... *H04W 28/26* (2013.01); *H04W 74/006* (2013.01); *H04W 76/11* (2018.02); *H04W 72/042* (2013.01); *H04W 72/0446* (2013.01)

(56) References Cited

U.S. PATENT DOCUMENTS

| | | | |
|---|---|---|---|
| 2016/0073366 A1* | 3/2016 | Ng | H04W 56/001 370/329 |
| 2016/0212735 A1* | 7/2016 | Nogami | H04L 5/0048 |
| 2016/0323852 A1* | 11/2016 | Golitschek Edler von Elbwart | H04W 72/0446 |
| 2017/0347270 A1* | 11/2017 | Iouchi | H04W 16/14 |
| 2018/0145851 A1* | 5/2018 | Kusashima | H04L 5/0057 |
| 2018/0205534 A1* | 7/2018 | Yi | H04L 5/1469 |
| 2018/0270041 A1* | 9/2018 | Lee | H04L 1/1812 |
| 2018/0294850 A1* | 10/2018 | Frenger | H04B 7/0413 |
| 2018/0302926 A1* | 10/2018 | Bhorkar | H04W 28/065 |
| 2019/0150170 A1* | 5/2019 | Park | H04W 72/1268 |

FOREIGN PATENT DOCUMENTS

| | | |
|---|---|---|
| CN | 104519515 A | 4/2015 |
| CN | 105517061 A | 4/2016 |
| CN | 105722225 A | 6/2016 |
| EP | 2 897 318 A1 | 7/2015 |

OTHER PUBLICATIONS

Written Opinion for International Application No. PCT/CN2016/092471, dated Oct. 28, 2016.

Extended European Search Report for European Application No. 16884651.7 dated Jul. 9, 2019.

[No Author Listed], Downlink signaling for LAA transmission burst related information. 3GPP TSG RAN WG1 Meeting #83. Huawei, HiSilicon. Nov. 2015. 10 pages. URL:http://www.3gpp.org/ftp/Meetings_3GPP_SYNC/RAN1/Docs [retrieved on Nov. 15, 2015].

* cited by examiner

METHOD FOR INDICATING UPLINK SUBFRAME ON UNLICENSED SPECTRUM AND BASE STATION

CROSS REFERENCE TO RELATED APPLICATIONS

The present disclosure is a national stage filing under 35 U.S.C. § 371 of International Patent Application Serial No. PCT/CN2016/092471, entitled "Method and Device for Indicating Uplink Subframe on Unlicensed Spectrum", filed Jul. 30, 2016. Foreign priority benefits are claimed under 35 U.S.C. § 119(a)-(d) or 35 U.S.C. § 365(b) of the Chinese patent application No. 201610032198.0, entitled "Method and Device for Indicating Uplink Subframe on Unlicensed Spectrum", filed on Jan. 15, 2016 in the Chinese Patent Office, the entirety of which is incorporated herein by reference.

TECHNICAL FIELD

The present disclosure relates to the field of communication technology, and relates to, for example, a method for indicating an uplink subframe on an unlicensed spectrum and a base station.

BACKGROUND

With a rapid increase in communications traffic, a licensed spectrum of the third generation partnership project (3GPP) is becoming less and less adequate to provide higher network capacity. In order to improve the utilization of spectrum resources, unlicensed spectrums such as 2.4 GHz and 5 GHz bands may already be used in the related art. These unlicensed spectrums are currently mainly used by wireless fidelity (WiFi), Bluetooth, radar, medical and other systems. In order to use a long term evolution (LTE) standard on unlicensed bands, the 3GPP proposes the concept of licensed assisted access (LAA), which uses the unlicensed spectrums with the help of LTE licensed spectrums. However, the unlicensed spectrums may have two working modes, one mode is a supplemental downlink (SDL) mode, i.e., a downlink only includes a transmission subframe; and the other mode is a time division duplexing (TDD) mode, i.e., an uplink and a downlink both include transmission subframes.

In addition, access technologies, such as a WiFi access technology, used on the unlicensed spectrums have poorer anti-interference capability. To avoid the interference, a lot of anti-interference rules are designed in a WiFi system, such as a carrier sense multiple access/collision detection (CSMA/CA) method. A basic principle of this method is that a WiFi access point (AP) or a terminal must firstly sense and detect whether there is an AP or a terminal that is transmitting/receiving a signaling or data in the vicinity before transmitting a signaling or data. If the AP or the terminal senses and detects that there is the AP or the terminal that is transmitting/receiving the signaling or data in the vicinity, this AP or this terminal continues to sense until it is not sensed. If the AP or the terminal senses and detects that there is no AP or terminal that is transmitting/receiving the signaling or data in the vicinity, a random number is generated as a backoff time. In this backoff time, if the AP or the terminal still does not sense and detect that there is the AP or the terminal that is transmitting/receiving the signaling or data in the vicinity, then after the backoff time is over, the AP or the terminal may start transmitting the signaling or data.

In a LTE network, since good orthogonality guarantees an interference level, uplink and downlink transmissions between a base station and a user do not need to consider whether there is a base station or a user that performs transmission in the vicinity. If the LTE does not consider whether there are other devices that use the unlicensed bands in the vicinity when being used on the unlicensed bands, great interference will be brought to the WiFi device. Since as long as there is a service, the LTE transmits it, without any sensing rules, the WiFi device may not perform transmission when the LTE transmits the service, and as long as transmitting the service by the LTE is completed, a channel idle state may be detected, and the WiFi device may perform the transmission.

Accordingly, when the LTE uses the unlicensed bands, it is necessary to ensure that the LAA may coexist with the related access technologies, such as the WiFi access technology, on a fair and friendly basis. However, there is no listen before talk (LBT) mechanism in the traditional LTE system to avoid collisions. In order to better coexist with the WiFi system, the LTE needs a LBT mechanism. In this way, if the LTE detects that a channel is busy on the unlicensed spectrum, the band may not be occupied. If the LTE detects that the channel is idle, the band may be occupied.

However, the inventor has found through a research that when the unlicensed spectrum is used in a TDD manner in the related art, since uplink and downlink configurations of the conventional TDD are fixed, a ratio of uplink and downlink time slots is inflexible, if downlink data is transmitted, uplink and downlink transitions occur due to the fixed uplink and downlink configurations, the channel resources may be snatched by the WiFi device, and a process for transmitting downlink data may be interrupted frequently. Therefore, the TDD manner in the related art is inflexible in uplink and downlink configurations and low in transmission efficiency.

SUMMARY

In view of this, in order to solve problems of inflexible uplink and downlink configurations and low transmission efficiency of the TDD manner mentioned above in the related art.

An embodiment of the present disclosure proposes a method for indicating an uplink subframe on an unlicensed spectrum, including:

determining a current indication period and a next indication period according to a preset period duration;

acquiring an indication position preset in the current indication period, where the indication position is a timing position of one or more preset downlink subframes; and when the indication position in the current indication period arrives, transmitting indication signaling in a downlink subframe corresponding to the indication position, such that a terminal receiving the downlink subframe acquires a timing position of the uplink subframe within a time range of the current indication period or the next indication period according to the indication signaling.

Alternatively, the timing position of the downlink subframe includes a timing position of a special subframe including a downlink pilot time slot (DwPTS).

Alternatively, the indication signaling is downlink control information (DCI) signaling.

Alternatively, the DCI signaling is carried by a common search space of a physical downlink control channel (PDCCH), the DCI signaling has a format of format 1C, and a cyclic redundancy check (CRC) code of the DCI signaling scrambles a licensed-assistance access radio network temporary identity (LAA-RNTI).

Alternatively, the preset period duration is 5 ms, 10 ms, 20 ms, 40 ms or 80 ms.

Alternatively, the indication position preset in the current indication period includes at least one of the following configurations:

a timing position of a first downlink subframe in the current indication period, where the indication signaling correspondingly indicates an uplink subframe in the current indication period;

or a timing position of one or more downlink subframes except the first downlink subframe in the current indication period, where the indication signaling correspondingly indicates an uplink subframe in the next indication period; or a timing position of one or more downlink subframes in a last frame in the current indication period, where the indication signaling correspondingly indicates an uplink subframe in the next indication period; or a timing position of one or more downlink subframes preceding the first uplink subframe in the current indication period, where the indication signaling correspondingly indicates an uplink subframe in the current indication period; or a timing position of one or more downlink subframes preceding each uplink subframe in the current indication period, where the indication signaling correspondingly indicates an uplink subframe in the current indication period.

Alternatively, after acquiring the indication position preset in the current indication period, the method further includes:

notifying the indication position by radio resource control (RRC) signaling to a terminal, the terminal acquires the indication position by receiving the RRC signaling and detects indication signaling at the indication position.

Alternatively, the indication signaling includes a bit sequence, the number of bits in the bit sequence is the same as the number of subframes in the preset period duration, and positions of 0/1 in the bit sequence respectively correspond to relative timing positions of the uplink subframes in the indication period.

Alternatively, the indication signaling includes identification information corresponding to a preset uplink subframe allocation configuration, and the uplink subframe allocation configuration includes timing positions of uplink and downlink subframes in a TDD frame.

Alternatively, the preset uplink subframe allocation configuration includes one of the following: DDDDDDDDDD, DDDDDDDDDU, DDDDDDDDU, DDDDDDDUUU, DDDDDDUUUU, DDDDDUUUUU, and DDDDUUUUUU, where D is a timing position of a downlink subframe in the TDD frame, and U is a timing position of an uplink subframe in the TDD frame.

Alternatively, the preset uplink subframe allocation configuration includes one of the following: DDDDDDDDDS, DDDDDDDDSU, DDDDDDDSUU, DDDDDDSUUU, DDDDDSUUUU, DDDDSUUUUU, and DDDSUUUUUU, where D is a timing position of a downlink subframe in the TDD frame, and U is a timing position of an uplink subframe in the TDD frame, and S is a timing position of a special subframe in the TDD frame.

Alternatively, a last one or two symbols in a previous subframe of a timing position set for a first uplink subframe are a position of the UpPTS of a special subframe, and after receiving the indication signaling and acquiring an allocated timing position of the uplink subframe, the terminal transmits a PRACH and/or SRS at a position of the last one or two symbols in the previous subframe of the timing position of the first uplink subframe, or a position of a last one or two symbols in a previous subframe of the timing position of the uplink subframe.

Furthermore, an embodiment of the present disclosure further proposes a device for indicating an uplink subframe on an unlicensed spectrum, including:

an indication period determination module, which is configured to determine a current indication period and a next indication period according to a preset period duration;

an indication position acquisition module, which is configured to acquire an indication position preset in the current indication period, where the indication position is a timing position of one or more preset downlink subframes; and an indication signaling transmission module, which is configured to: when the indication position in the current indication period arrives, transmit indication signaling in a downlink subframe corresponding to the indication position, such that a terminal receiving the downlink subframe acquires a timing position of the uplink subframe within a time range of the current indication period or the next indication period according to the indication signaling.

Alternatively, the timing position of the downlink subframe includes a timing position of a special subframe including a downlink pilot time slot (DwPTS).

Alternatively, the indication signaling is downlink control information (DCI) signaling.

Alternatively, the DCI signaling is carried by a common search space of a physical downlink control channel (PDCCH), the DCI signaling has a format of format 1C, and a cyclic redundancy check (CRC) code of the DCI signaling scrambles a licensed-assistance access radio network temporary identity (LAA-RNTI).

Alternatively, the preset period duration is 5 ms, 10 ms, 20 ms, 40 ms or 80 ms.

Alternatively, the preset indication position includes at least one of the following configurations:

a timing position of a first downlink subframe in the current indication period, where the indication signaling correspondingly indicates an uplink subframe in the current indication period; or a timing position of one or more downlink subframes except the first downlink subframe in the current indication period, where the indication signaling correspondingly indicates an uplink subframe in the next indication period; or a timing position of one or more downlink subframes in a last frame in the current indication period, where the indication signaling correspondingly indicates an uplink subframe in the next indication period; or a timing position of one or more downlink subframes preceding the first uplink subframe in the current indication period, where the indication signaling correspondingly indicates an uplink subframe in the current indication period; or a timing position of one or more downlink subframes preceding each uplink subframe in the current indication period, where the indication signaling correspondingly indicates an uplink subframe in the current indication period.

Alternatively, after acquiring the indication position preset in the current indication period, the method further includes: notifying the indication position by radio resource control (RRC) signaling to a terminal, the terminal acquires the indication position by receiving the RRC signaling and detects indication signaling at the indication position.

Alternatively, the indication signaling includes a bit sequence, the number of bits in the bit sequence is the same as the number of subframes in the preset period duration, and positions of 0/1 in the bit sequence respectively correspond to relative timing positions of the uplink subframes in the indication period.

Alternatively, the indication signaling includes identification information corresponding to a preset uplink subframe allocation configuration, and the uplink subframe allocation configuration includes timing positions of uplink and downlink subframes in a TDD frame.

Alternatively, the preset uplink subframe allocation configuration includes one of the following: DDDDDDDDDD, DDDDDDDDDU, DDDDDDDDU, DDDDDDDUUU, DDDDDDUUUU, DDDDDUUUUU, and DDDD-UUUUUU, where D is a timing position of a downlink subframe in the TDD frame, and U is a timing position of an uplink subframe in the TDD frame.

Alternatively, the preset uplink subframe allocation configuration includes one of following: DDDDDDDDDS, DDDDDDDDSU, DDDDDDDSUU, DDDDDDSUUU, DDDDDSUUUU, DDDDSUUUUU, and DDDSUUUUUU, where D is a timing position of a downlink subframe in the TDD frame, and U is a timing position of an uplink subframe in the TDD frame, and S is a timing position of a special subframe in the TDD frame.

Alternatively, a last one or two symbols in a previous subframe of a timing positon set for a first uplink subframe are a position of the UpPTS of a special subframe, and after receiving the indication signaling and acquiring an allocated timing position of the uplink subframe, the terminal transmits a physical random access channel (PRACH) and/or a sense reference signal (SRS) at a position of the last one or two symbols in the previous subframe of the timing position of the first uplink subframe, or a position of a last one or two symbols in a previous subframe of the timing position of the uplink subframe.

An embodiment of the present disclosure further proposes a non-transitory computer-readable storage medium storing computer-executable instruction for performing any one of the methods for indicating an uplink subframe on an unlicensed spectrum.

An embodiment of the present disclosure further proposes a terminal, including one or more processors, a memory, and one or more programs, where the one or more programs are stored in the memory, when the one or more programs are executed by one or more processors, the one or more processors performs/perform any one of the methods for indicating an uplink subframe on an unlicensed spectrum.

BRIEF DESCRIPTION OF DRAWINGS

In order to more clearly describe the technical solution in embodiments of the present disclosure or a related art, drawings used in the description of alternative embodiments will be briefly described below. Apparently, the embodiments described herein are merely partial embodiments of the present disclosure instead of whole embodiments.

DETAILED DESCRIPTION

The following describes the technical solution in embodiments of the present disclosure with reference to drawings in the embodiments of the present disclosure. Obviously, the described embodiments are merely some but not all of the embodiments of the present disclosure.

Figure 1:
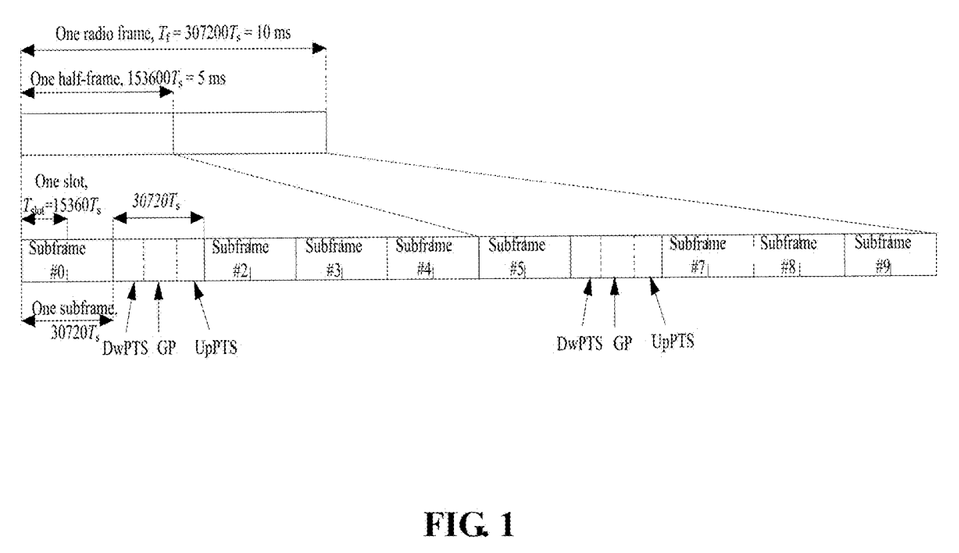
FIG. 1 is a diagram showing a frame structure of a TDD frame in the related art.

A frame structure of a TDD frame in a related art may be as shown in FIG. 1. One TDD frame may have a time duration of 10 ms and may be divided into 10 subframes. Each subframe has a duration of 1 ms, and these subframes are respectively numbered from a subframe 0 to a subframe 9. Each subframe may include an uplink subframe U, a downlink subframe D, and a special subframe S. In one TDD frame, a sequence position of a subframe sequence is a timing position of a time-division resource allocated to the subframe. For example, if one TDD frame is defined as DSUUDSUUU, then in the timing order, within the first 1 ms of transmission of the TDD frame, the time-division resource is allocated for downlink transmission, and within the third 1ms, the time-division resource is allocated for uplink transmission.

In the related art, the allocation of the uplink subframe and the downlink subframe in a TDD subframe is relatively fixed, and seven kinds of TDD frame structures are generally included. The seven kinds of TDD frame structures define a sorting order of seven uplink and downlink subframes in different timing orders within the TDD frame. As shown in Table 1, uplink and downlink subframe configurations in the seven kinds of TDD frame structures in the related art are given:

TABLE 1

| Number of Uplink and downlink Configurations | Period of Downlink to Uplink Transition Point | Number of Subframe Sequence | | | | | | | | |
|---|---|---|---|---|---|---|---|---|---|---|
| | | 0 | 1 | 2 | 3 | 4 | 5 | 6 | 7 | 8 | 9 |
| 0 | 5 ms | D | S | U | U | U | D | S | U | U | U |
| 1 | 5 ms | D | S | U | U | D | D | S | U | U | D |
| 2 | 5 ms | D | S | U | D | D | D | S | U | D | D |
| 3 | 10 ms | D | S | U | U | U | D | D | D | D | D |
| 4 | 10 ms | D | S | U | U | D | D | D | D | D | D |
| 5 | 10 ms | D | S | U | D | D | D | D | D | D | D |
| 6 | 5 ms | D | S | U | U | U | D | S | U | U | D |

Among them, the period of the downlink-to-uplink transition point is a period in which a position of the special subframe occurs. Since the downlink-to-uplink transition is easily affected by a neighboring base station and a terminal, the special subframe S is required to be configured within the TDD subframe or within the TDD frame to avoid interference from the neighboring base station and the terminal.

If it is necessary to allocate all the time-division resources within a TDD subframe or a TDD frame for transmitting a downlink subframe, it may be seen from the seven kinds of TDD frame structures in the related art that during the transmission of the downlink subframe, the uplink and downlink subframe transition occurs, and there may be other WIFI devices in the uplink subframe to preempt the time-division resources, when the downlink subframe needs to be transmitted again, the base station needs to detect again that other WIFI devices do not preempt the time-division resources within the TDD subframe or within the TDD frame, downlink subframe transmission may be started. Therefore, the TDD manner in the related art is inflexible in uplink and downlink configurations and low in transmission efficiency.

Accordingly, in order to solve problems of inflexible uplink and downlink configurations and low transmission efficiency of the TDD manner mentioned above in the related art, in the embodiment of the present disclosure, a method for indicating an uplink subframe on an unlicensed spectrum is proposed. The method may be implemented by a base station supporting a LAA system.

Figure 2:
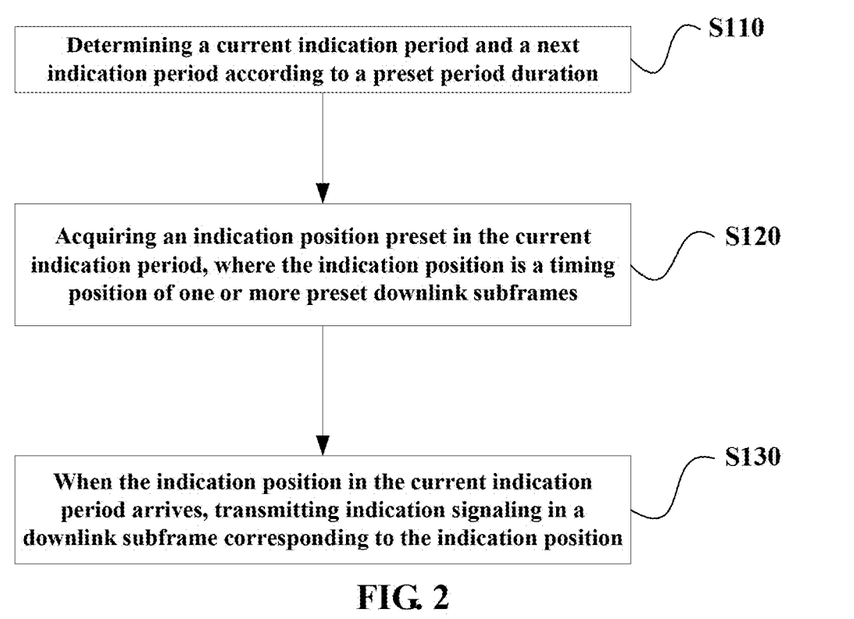
FIG. 2 is a flow chart of a method for indicating an uplink subframe on an unlicensed spectrum in an embodiment of the present disclosure.

Alternatively, as shown in FIG. 2, the method includes:

In S110, a current indication period and a next indication period are determined according to a preset period duration.

In this embodiment, the preset period duration may be an integral multiple of the subframe length. If the subframe length is 1 ms, the preset period duration is N lms, where N is a positive integer greater than or equal to 1. In order to adapt the seven kinds of TDD frame structures in the related art, the preset period duration may be 5 ms (N=5), 10 ms (N=10), 20 ms (N=20), 40 ms (N=40), or 80 ms (N=80).

For example, if the preset period duration is 10 ms, the current indication period is the length of ten subframes. In combination with a start time position of the current indication period and the current time, an end time position of the current indication period may be known, and the end time position may be a start time position of the next indication period.

In S120, acquiring an indication position preset in the current indication period, where the indication position is a timing position of one or more preset downlink subframes.

In S130, when the indication position in the current indication period arrives, indication signaling is transmitted in a downlink subframe corresponding to the indication position, such that the terminal acquires a timing position of the uplink subframe within a time range of the current indication period or the next indication period according to the received indication signaling.

The indication position is a time position at which the base station transmits the indication signaling to the terminal through the downlink subframe, that is, a sequence number of the downlink subframe through which the indication signaling is transmitted by the base station. The downlink subframe, which may be preset in the current indication period, of one or more timing positions may be used to transmit the indication signaling. In this embodiment, the indication position in the current indication period may be determined according to the service requirement at the start position of each current indication period.

In this embodiment, the preset position preset in the current indication period may include a configuration manner in which the base station selects the downlink subframe as the timing position at which the indication signaling is transmitted, for example:

A first manner, a timing position of the first downlink subframe in the current indication period.

For example, if the current indication period is 10 ms, and the start position of the current indication period is the same as the start position of the TDD frame, the indication signaling may be transmitted at the timing position of the first downlink subframe in each TDD frame. With reference to FIG. 1, if the first subframe 0 in the TDD frame is a downlink subframe, the base station transmits an indication signaling at a time position of the subframe 0, and the indication signaling indicates a position of the uplink subframe in the current indication period.

Alternatively, for example, if the current indication period is 5 ms, and the start position of the current indication period is the same as the start position of the time slot in the TDD frame, the indication signaling may be transmitted at the timing position of the first downlink subframe of each time slot in each TDD frame. With reference to FIG. 1, if the first subframe 0 or subframe 5 of each time slot in the TDD frame is a downlink subframe, the base station transmits the indication signaling at a time position of the subframe 0 or subframe 5, and the indication signaling indicates an uplink subframe position in the current indication period.

A second manner, a timing position of one or more downlink subframes except the first downlink subframe in the current indication period.

For example, if the current indication period is 10 ms, and the start position of the current indication period is the same as the start position of the TDD frame, the indication signaling may be transmitted at the timing position of one or more downlink subframes except the first downlink subframe in each TDD frame. With reference to FIG. 1, if the uplink and downlink subframe configuration of the TDD frame is DSUDDDSUDD, except that the subframe 0 is a downlink subframe, the subframe 3 in the TDD frame is a downlink subframe, the base station may transmit the indication signaling at the time position of the subframe 3, and the indication signaling indicates the next indication period, that is, the position of the uplink subframe in the next radio frame.

Alternatively, for example, if the current indication period is 5 ms, and the start position of the current indication period is the same as the start position of each time slot in the TDD frame, the indication signaling may be transmitted at the timing position of the downlink subframe except the timing position of the first downlink subframe within each time slot in each TDD frame. With reference to FIG. 1, if the uplink and downlink subframe configuration of the TDD frame is DSUDDDSUDD, the subframe 3 of the TDD frame is a downlink subframe except the subframe 0, the base station may transmit the indication signaling at the time position of the subframe 3, and the indication signaling indicates the position of the uplink subframe of the subframe 5 to subframe 9 in the next indication period, that is, in the current frame.

A third manner, a timing position of one or more downlink subframes in the last frame in the current indication period.

For example, if the current indication period is 20 ms/40 ms/80 ms, and the start position of the current indication period is the same as the start position of the TDD frame, the indication signaling may be transmitted at a timing position of any downlink subframe in a mT/10 frame, and the indication signaling indicates a next indication period, and the next indication period may be a position where the uplink subframe of a radio frame (mT/10)+1, (mT/10)+2, . . . , or (m+1)T/10 is located. With reference to FIG. 1, if the uplink and downlink subframe configuration of the TDD frame is DSUUDDSUUD, the current indication period T is 20 ms, the current indication period includes radio frames 0 and 1, and the next indication period includes radio frames 2 and 3. The base station transmits the indication signaling at the timing position of one or more downlink subframes in the radio frame 1, such as the subframe 4 and/or the subframe 5, in the current indication period, and the indication signaling indicates positions of uplink subframes of the radio frames 2 and 3 in the next indication period.

A fourth manner 4, a timing position of one or more downlink subframes preceding the first uplink subframe in the current indication period.

For example, if the current indication period is 10 ms, and the start position of the current indication period is the same as the start position of the TDD frame. With reference to FIG. 1, if the uplink and downlink subframe configuration of the TDD frame is DDDDSUUUUU, and the subframe 5 of the TDD frame corresponding to the current indication period is the first uplink subframe, then the indication signaling is transmitted at one or more timing positions in the downlink subframes (subframe 0 to subframe 3) or the special subframe 4 preceding the uplink subframe, and the indication signaling indicates the position of the uplink subframe of the current indication period.

A fifth manner, a timing position of one or more downlink subframes preceding each uplink subframe in the current indication period.

For example, if the current indication period is 10 ms, and the start position of the current indication period is the same as the start position of the TDD frame. With reference to FIG. 1, if the uplink and downlink subframe configuration of the TDD frame is DSUUDDSUUD, subframes 2, 3, 7, and 8 of the TDD frame corresponding to the current indication period are uplink subframes, the indication signaling is transmitted at one or more timing positions of the subframes 0, 1 and the subframes 4, 5, and 6, and the indication signaling indicates the position of the uplink subframe of the current indication period.

It should be noted that the above-mentioned downlink subframe includes not only the downlink subframe D defined in the frame structure of the TDD frame as shown in FIG. 1, but also a timing position of a downlink pilot time slot (DwPTS) of the special subframe S defined in the frame structure of the TDD frame (the base station may also transmit the data at a downlink in the DwPTS). That is, the base station may transmit the indication signaling at the timing position of the downlink subframe D, and may also transmit the indication signaling at the timing position of the DwPTS of the special subframe.

In addition, it should be noted that the indication position in each indication period may be different, as described above, it may be determined at the start position of one indication period which downlink subframes are selected as indication positions at which the indication signaling is transmitted. However, after entering the next indication period, the indication position may be replaced to transmit the indication signaling. For example, in accordance with a chronological order, a transmission process of the base station may undergo multiple indication periods. In the first indication period, the base station may select the first downlink subframe in the first indication period to transmit the indication signaling by adopting the first manner. In the second indication period, the base station may also select all the downlink subframes in the second indication period to transmit the indication signaling by adopting the third manner according to the service requirement.

In this embodiment, according to the service requirement, the base station may further notify the indication position through RRC signaling to the terminal after acquiring the indication position preset in the current indication period through the decision, so as to instruct the terminal to acquire the indication position by receiving the RRC signaling and detect the indication signaling at the indication position.

In this embodiment, when a moment of the indication position arrives, the indication signaling is transmitted by using a time-division resource of the corresponding downlink subframe. Alternatively, the indication signaling is downlink control information (DCI) signaling. The DCI signaling used to indicate the terminal may be transmitted by a licensed band or may be transmitted by an unlicensed band, and may be carried by a common search space of a physical downlink control channel (PDCCH), and may have a format of format 1C. A cyclic redundancy check (CRC) code of the DCI signaling may scramble a licensed-assistance access-radio network temporary identity (LAA-RNTI).

In the present disclosure, a semantic format of the DCI signaling may be defined in two ways to indicate the position of the uplink subframe in the current indication period or the next indication period of the terminal.

A First Embodiment

In this embodiment, the indication signaling includes a bit sequence, for example, a DCI bit sequence, the number of bits in the bit sequence is the same as the number of subframes in the preset period duration, and positions of 0/1 in the bit sequence respectively correspond to relative timing positions of the uplink subframes in the indication period.

For example, if the current indication period is 10 ms, and the start position is the same as the start position of the TDD frame, a DCI bit sequence is a 10-bit bit sequence, for example, 1 is used to represent an uplink subframe, 0 is used to represent a downlink subframe and a special subframe, and if pre-allocated subframes 3 and 8 in the next indication period are uplink subframes, a corresponding DCI bit sequence is 0001000010, where the 4th bit of the sequence corresponds to the subframe 3, and the 9th bit corresponds to the subframe 8, and the sequence order in the DCI bit sequence corresponds to the timing order of the subframe in the TDD frame.

In the manner in which the DCI bit sequence is defined in this embodiment, the bit in the DCI bit sequence includes all the possibilities for allocating the uplink subframes, so that this method is more flexible. However, if the preset indication period is long, for example, 80 ms, the length of the DCI bit sequence will reach 80 bits, such that the data that needs to be transmitted is increased, which will affect the transmission efficiency.

A Second Embodiment

In this embodiment, the indication signaling includes identification information corresponding to a preset uplink subframe allocation configuration, and the uplink subframe allocation configuration includes timing positions of uplink and downlink subframes in a TDD frame.

That is, the frame structure of the TDD frame may be extended in advance, and the seven frame structures will be extended into multiple kinds of frame structures. However, the method of extending the frame structure of the TDD frame in advance may optionally only change the timing sequence/or a distribution ratio of the uplink subframe and the downlink subframe, then each frame structure may be numbered by using identification information of less bits, and the terminal is notified of a mapping relationship between the identity and the frame structure in advance. Then, in the indication signaling, only the identification information of the configuration of the corresponding frame structure needs to be transmitted, the terminal may be instructed to receive the indication signaling, and a frame structure corresponding to the corresponding identification information is found according to the mapping relationship, so that the terminal may obtain the position of the uplink subframe in the current indication period or the next indication period according to the frame structure.

Alternatively, in this embodiment, the extended frame structure, that is, the uplink subframe allocation configuration of the TDD frame, may include:

an eighth frame structure: DDDDDDDDDD or DDDDDDDDDS, a ninth frame structure: DDDDDDDDDU or DDDDDDDDSU, a tenth frame structure: DDDDDDDDUU or DDDDDDDSUU, an eleventh frame structure: DDDDDDDUUU or DDDDDDSUUU, a twelfth frame structure: DDDDDDUUUU or DDDDDSUUUU, a thirteenth frame structure: DDDDDUUUUU or DDDDSUUUUU, and a fourteenth frame structure: DDDDUUUUUU or DDDSUUUUUU.

Among them, D is a timing position of the downlink subframe in the TDD frame, U is a timing position of the uplink subframe in the TDD frame, and S is a timing position of the special subframe in the TDD frame. In combination with the seven kinds of frame structures of the TDD frame in the related art listed in Table 1 above, there are fourteen kinds of frame structures for selection in the embodiment of the present disclosure. Accordingly, a one-to-one correspondence between the frame structure and the identification information may be established by using 4-bit numerical values as the identification information. In comparison with the foregoing technical solution in the first embodiment of the present disclosure, the technical solution of the second embodiment of the present disclosure has the advantages that the base station may transmit shorter identification information, the transmitted data volume is relatively small, and the transmission efficiency is relatively high.

It should be noted that representations of the extended frame structure, that is, the uplink subframe allocation configuration, in different embodiments and application scenarios may not be limited to the above-mentioned U, D, S representations. Describing the multiple extended TDD frame structures by the U, D, S representations is only used to illustrate the timing sequence of the uplink subframes in the extended frame structure, but does not limit the representation or storage form of the frame structure itself.

Alternatively, in another embodiment, the extended frame structure, that is, the uplink subframe allocation configuration, may further include: DDDDDDDDDS, DDDDDDDDSU, DDDDDDDSUU, DDDDDDSUUU, DDDDDSUUUU, DDDDSUUUUU, and DDDSUUUUUU. In the extended frame structure of this embodiment, a part of the downlink subframe may be set as special subframes, but since the DwPTSs of the special subframes may also be used to transmit the indication signaling, the special subframes S in this configuration may also be considered as downlink subframes in a broad sense.

The terminal receives the RRC signaling before the start time of the current indication period, according to the RRC signaling, it is determined that it is necessary to receive the indication signaling at the timing position of one or more subframes in the current indication period, and then it detects the DCI signaling that the CRC code scrambles the LAA-RNTI in the common search space of the PDCCH in these subframes.

In addition, a last one or two symbols of the subframe preceding the uplink subframe firstly occurring when the downlink subframe is transitioned into the uplink subframe in each indication period may be set as a position of the UpPTS (With reference to FIG. 1) of the special subframe. Because the UpPTS may be used to transmit the PRACH and the SRS, the terminal may obtain the timing position of the uplink subframe according to the indication signaling, and may also obtain the position of the UpPTS, and thus the PRACH and/or SRS may be transmitted at the position (which may be the timing position of the uplink subframe or the downlink subframe or the special subframe) of the last one or two symbols of the uplink subframe or a subframe preceding the first uplink subframe.

Figure 3:
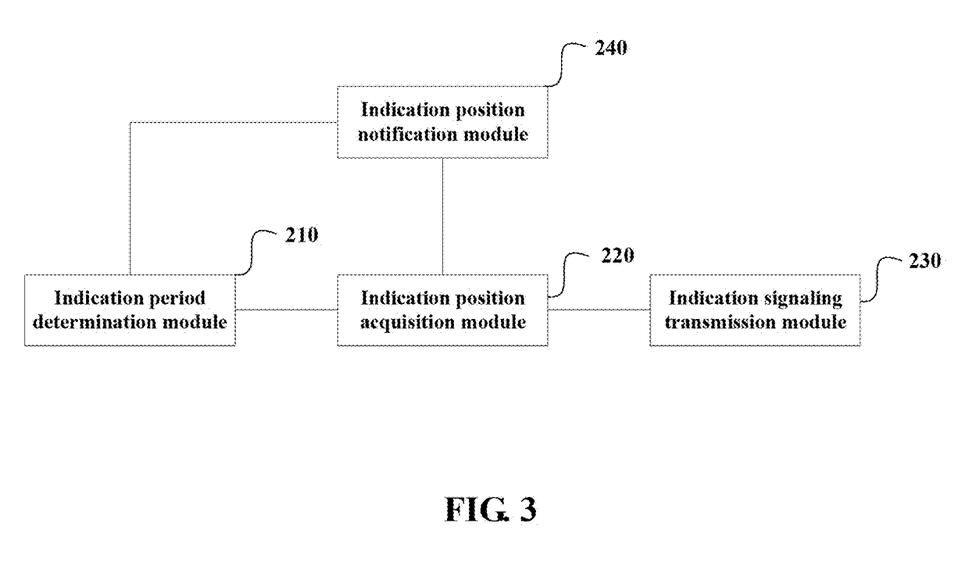
FIG. 3 is a schematic diagram showing a device for indicating an uplink subframe on an unlicensed spectrum in an embodiment of the present disclosure.

To solve problems of uplink and downlink configuration and low transmission efficiency of the above-mentioned TDD manner in the related art, in this embodiment, as shown in FIG. 3, a device for indicating an uplink subframe on an unlicensed spectrum is proposed. The device includes: an indication period determining module 210, an indication position acquisition module 220 and an indication signaling transmission module 230, where the indication period determination module 210 is configured to determine a current indication period and a next indication period according to a preset period duration;

the indication position acquisition module 220 is configured to acquire an indication position preset in the current indication period, where the indication position is a timing position of one or more preset downlink subframes; and the indication signaling transmission module 230 is configured to: when the indication position in the current indication period arrives, transmit indication signaling in a downlink subframe corresponding to the indication position.

Alternatively, in this embodiment, the timing position of the downlink subframe includes a timing position of a special subframe including a downlink pilot time slot (DwPTS).

Alternatively, in this embodiment, the indication signaling is downlink control information (DCI) signaling.

Alternatively, in this embodiment, the DCI signaling is carried by a common search space of a physical downlink control channel (PDCCH), the DCI signaling has a format of format 1C, and a cyclic redundancy check (CRC) code of the DCI signaling scrambles a licensed-assistance access radio network temporary identity (LAA-RNTI).

Alternatively, in this embodiment, the preset period duration is 5 ms, 10 ms, 20 ms, 40 ms or 80 ms.

Alternatively, in this embodiment, the indication position preset in the current indication period includes at least one of the following configurations:

a timing position of a first downlink subframe in the current indication period, where the indication signaling correspondingly indicates an uplink subframe in the current indication period; or a timing position of one or more downlink subframes except the first downlink subframe in the current indication period, where the indication signaling correspondingly indicates an uplink subframe in the next indication period; or a timing position of one or more downlink subframes in a last frame in the current indication period, where the indication signaling correspondingly indicates an uplink subframe in the next indication period; or a timing position of one or more downlink subframes preceding the first uplink subframe in the current indication period, where the indication signaling correspondingly indicates an uplink subframe in the current indication period; or a timing position of one or more downlink subframes preceding each uplink subframe in the current indication period, where the indication signaling correspondingly indicates an uplink subframe in the current indication period.

Alternatively, in this embodiment, as shown in FIG. 3, the device further includes: an indication position notification module 240, which is configured to notify the indication position by a radio resource control (RRC) signaling to a terminal, the terminal acquires the indication position by receiving the RRC signaling and detects the indication signaling at the indication position.

Alternatively, in this embodiment, the indication signaling includes a bit sequence, the number of bits in the bit sequence is the same as the number of subframes in the preset period duration, and positions of 0/1 in the bit sequence respectively correspond to relative timing positions of the uplink subframes in the indication period.

Alternatively, in this embodiment, the indication signaling includes identification information corresponding to a preset uplink subframe allocation configuration, and the uplink subframe allocation configuration includes timing positions of uplink and downlink subframes in a TDD frame.

Alternatively, in one embodiment, the preset uplink subframe allocation configuration includes one of the following: DDDDDDDDD, DDDDDDDDU, DDDDDDDDU, DDDDDDDUUU, DDDDDDUUUU, DDDDDUUUUU, and DDDDUUUUUU, where D is a timing position of a downlink subframe in the TDD frame, and U is a timing position of an uplink subframe in the TDD frame.

Alternatively, in another embodiment, the preset uplink subframe allocation configuration includes one of the following: DDDDDDDDS, DDDDDDDSU, DDDDDDDSUU, DDDDDDSUUU, DDDDDSUUUU, DDDDSUUUUU, and DDDSUUUUUU, where D is a timing position of a downlink subframe in the TDD frame, and U is a timing position of an uplink subframe in the TDD frame, and S is a timing position of a special subframe in the TDD frame.

Alternatively, in this embodiment, a last one or two symbols, which are set as the timing position of the first uplink subframe when the downlink subframe is transitioned into the uplink subframe, of a previous subframe are a timing position of the UpPTS of the special subframe, and after receiving the indication signaling and acquiring an allocated timing position of the uplink subframe, the terminal transmits a PRACH and/or SRS at a position of the last one or two symbols in the previous subframe of the timing position of the first uplink subframe, or a position of a last one or two symbols in a previous subframe of the timing position of the uplink subframe.

An embodiment of the present disclosure further proposes a non-transitory computer-readable storage medium storing computer-executable instruction for performing any one of the methods for indicating an uplink subframe on an unlicensed spectrum.

Figure 4:
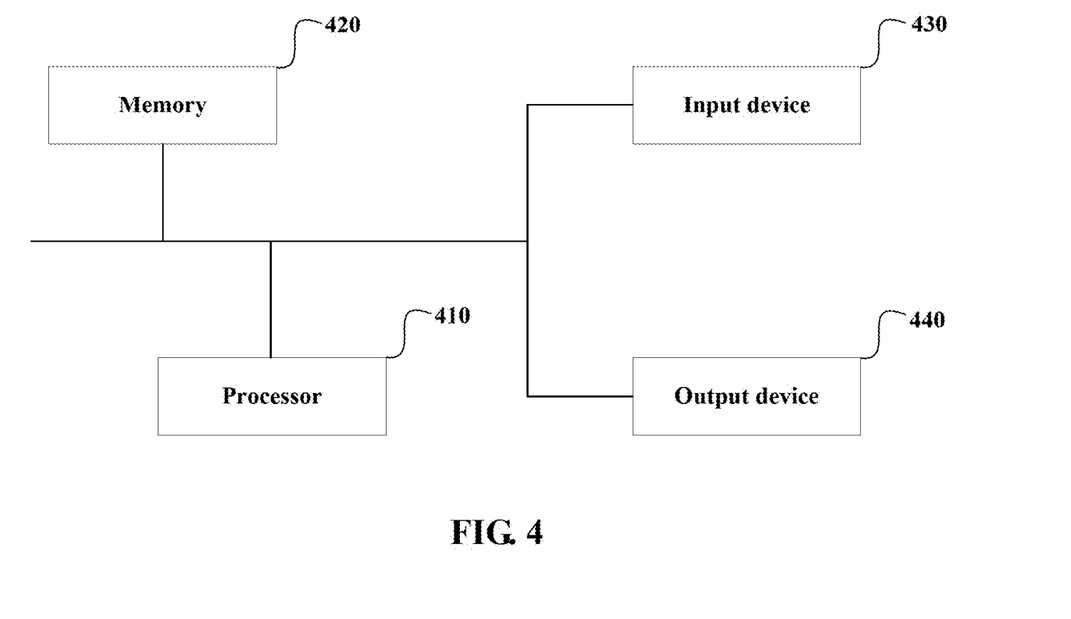
FIG. 4 is a schematic diagram showing a hardware structure of a terminal in an embodiment of the present disclosure.

An embodiment of the present invention further provides a schematic diagram showing a hardware structure of a base station. As shown in FIG. 4, the base station includes:

one or more processors 310, where one processor 310 serves as one example in FIG. 4;

a memory 320; and the base station may further include an input device 330 and an output device 340.

The processor 310, the memory 320, the input device 330, and the output device 340 in the base station may be connected through a bus or other manners. They may be connected through a bus in FIG. 4 by way of an example.

The memory 320, as a non-transitory computer-readable storage medium, may be used to store software programs, computer-executable programs, and modules, such as program instructions/modules (for example, the indication period determination module 210, the indication position acquisition module 220, and the indication signaling transmission module 230 shown in FIG. 2) corresponding to the method for indicating an uplink subframe on an unlicensed spectrum in an embodiment of the present disclosure. The processor 310 executes various functional applications and data processing of the server by running the software programs, the instructions, and the modules stored in the memory 320, that is, a method for implementing the method for indicating an uplink subframe on an unlicensed spectrum of the above method embodiments.

The memory 320 may include a storage program area and a storage data area, where the storage program area may store an operating system, and an application required by at least one function; the storage data area may store data created according to the use of a terminal device, and the like. Furthermore, the memory 320 may include a high-speed random access memory, and may also include a non-volatile memory, such as at least one magnetic disk storage device, a flash memory device, or other non-transient solid-state memory devices. In some embodiments, alternatively, the memory 320 includes a memory remotely disposed with respect to the processor 310, and these remote memories may be connected to the terminal device through a network. Examples of such networks include, but are not limited to, the Internet, the Intranet, a local area networks, a mobile communications network, and a combination thereof.

The input device 330 may be used to receive input numerical or character information, as well as generate key signal inputs related to user's settings and function control of the terminal. The output device 340 may include a display device such as a display screen.

The one or more modules are stored in the memory 320, and when executed by the one or more processors 310, perform the method of indicating an uplink subframe on an unlicensed spectrum in the above method embodiments.

Based on the foregoing method and device for indicating an uplink subframe on an unlicensed spectrum, a frame structure of a TDD frame is no longer limited to seven frame structures in the related art, and a base station may set a frame structure in a current indication period or a next indication period in each indication period, that is, set allocation information of a timing position order of uplink and downlink subframes. Even if there are transmission scenarios in which the seven frame structures defined in the conventional technology are inapplicable, the uplink subframe may still be dynamically allocated or adjusted periodically, and the transmission scenario may be adapted by notifying the terminal in the above manner. Therefore, the above method and device for indicating the uplink subframe on the unlicensed spectrum may make the frame structure of the TDD frame more dynamic and flexible, thereby being applicable to more transmission scenarios and improving the transmission efficiency.

What is claimed is:

1. A method for indicating an uplink subframe on an unlicensed spectrum, comprising:
   determining a current indication period and a next indication period according to a preset period duration;
   acquiring an indication position preset in the current indication period, wherein the indication position is a timing position of one or more preset downlink subframes; and
   when the indication position in the current indication period arrives, transmitting indication signaling in a downlink subframe corresponding to the indication position, such that a terminal receiving the downlink subframe acquires a timing position of the uplink subframe within a time range of the current indication period or the next indication period according to the indication signaling;

wherein the indication signaling comprises identification information corresponding to a preset uplink subframe allocation configuration, and the preset uplink subframe allocation configuration comprises timing positions of uplink and downlink subframes in a Time Division Duplexing (TDD) frame; and wherein the preset uplink subframe allocation configuration comprises one of the following: DDDDDDDDDS, DDDDDDDDSU, DDDDDDDSUU, DDDDDDSUUU, DDDDDSUUUU, DDDDSUUUUU, and DDDSUUUUUU, wherein D is a timing position of a downlink subframe in the TDD frame, and U is a timing position of an uplink subframe in the TDD frame, and S is a timing position of a special subframe in the TDD frame;

or the preset uplink subframe allocation configuration comprises one of the following: DDDDDDDDDD, DDDDDDDDDU, DDDDDDDDU, DDDDDDDD-UUU, DDDDDDUUUU, DDDDDUUUUU, and DDDDUUUUUU, wherein D is a timing position of a downlink subframe in the TDD frame, and U is a timing position of an uplink subframe in the TDD frame.

2. The method for indicating an uplink subframe on an unlicensed spectrum according to claim 1, wherein the timing position of the downlink subframe comprises a timing position of a special subframe comprising a downlink pilot time slot (DwPTS).

3. The method for indicating an uplink subframe on an unlicensed spectrum according to claim 1, wherein the indication signaling is downlink control information (DCI) signaling.

4. The method for indicating an uplink subframe on an unlicensed spectrum according to claim 3, wherein the DCI signaling is carried by a common search space of a physical downlink control channel (PDCCH), the DCI signaling has a format of format 1C, and a cyclic redundancy check (CRC) code of the DCI signaling scrambles a licensed-assistance access radio network temporary identity (LAA-RNTI).

5. The method for indicating an uplink subframe on an unlicensed spectrum according to claim 1, wherein the preset period duration is 5 ms, 10 ms, 20 ms, 40 ms or 80 ms.

6. The method for indicating an uplink subframe on an unlicensed spectrum according to claim 1, wherein the indication position preset in the current indication period comprises at least one of the following configurations:

a timing position of a first downlink subframe in the current indication period, wherein the indication signaling correspondingly indicates an uplink subframe in the current indication period; or a timing position of one or more downlink subframes except the first downlink subframe in the current indication period, wherein the indication signaling correspondingly indicates an uplink subframe in the next indication period; or a timing position of one or more downlink subframes in a last frame in the current indication period, wherein the indication signaling correspondingly indicates an uplink subframe in the next indication period; or a timing position of one or more downlink subframes preceding the first uplink subframe in the current indication period, wherein the indication signaling correspondingly indicates an uplink subframe in the current indication period; or a timing position of one or more downlink subframes preceding each uplink subframe in the current indication period, wherein the indication signaling correspondingly indicates an uplink subframe in the current indication period.

7. The method for indicating an uplink subframe on an unlicensed spectrum according to claim 1, wherein after acquiring the indication position preset in the current indication period, the method further comprises:

notifying the indication position by a radio resource control (RRC) signaling to a terminal, the terminal acquires the indication position by receiving the RRC signaling detects indication signaling at the indication position.

8. The method for indicating an uplink subframe on an unlicensed spectrum according to claim 1, wherein the indication signaling comprises a bit sequence, the number of bits in the bit sequence is the same as the number of subframes in the preset period duration, and positions of 0/1 in the bit sequence respectively correspond to relative timing positions of the uplink subframes in the indication period.

9. The method for indicating an uplink subframe on an unlicensed spectrum according to claim 1, wherein a last one or two symbols in a previous subframe of a timing position set for a first uplink subframe are a position of the UpPTS of a special subframe, and after receiving the indication signaling and acquiring an allocated timing position of the uplink subframe, the terminal transmits a Physical Random Access Channel (PRACH) and/or Sounding Reference Signal (SRS) at a position of the last one or two symbols in the previous subframe of the timing position of the first uplink subframe, or a position of a last one or two symbols in a previous subframe of the timing position of the uplink subframe.

10. A non-transitory computer-readable storage medium storing computer-executable instruction for performing the method for indicating an uplink subframe on an unlicensed spectrum according to claim 1.

11. A base station, comprising:
at least one processor; and
a memory communicably connected with the at least one processor and configured for storing computer-executable instruction executable by the at least one processor;
wherein the computer-executable instructions when executed by the at least one processor causes the at least one processor to perform:
determining a current indication period and a next indication period according to a preset period duration;
acquiring an indication position preset in the current indication period, wherein the indication position is a timing position of one or more preset downlink subframes; and
when the indication position in the current indication period arrives, transmitting indication signaling in a downlink subframe corresponding to the indication position, such that a terminal receiving the downlink subframe acquires a timing position of the uplink subframe within a time range of the current indication period or the next indication period according to the indication signaling;
wherein the indication signaling comprises identification information corresponding to a preset uplink subframe allocation configuration, and the preset uplink subframe allocation configuration comprises timing positions of uplink and downlink subframes in a Time Division Duplexing (TDD) frame; and wherein the preset uplink subframe allocation configuration comprises one of the following: DDDDDDDDS, DDDDDDDDSU, DDDDDDDSUU, DDDDDDSUUU, DDDDDSUUUU, DDDDSUUUUU, and DDDSUUUUUU, wherein D is a timing position of a downlink subframe in the TDD frame, and U is a timing position of an uplink subframe in the TDD frame, and S is a timing position of a special subframe in the TDD frame;

or the preset uplink subframe allocation configuration comprises one of the following: DDDDDDDDDD, DDDDDDDDDU, DDDDDDDDU, DDDDDDD-UUU, DDDDDDUUUU, DDDDDUUUUU, and DDDDUUUUUU, wherein D is a timing position of a downlink subframe in the TDD frame, and U is a timing position of an uplink subframe in the TDD frame.

12. The base station according to claim 11, wherein the timing position of the downlink subframe comprises a timing position of a special subframe comprising a downlink pilot time slot (DwPTS).

13. The base station according to claim 11, wherein the indication signaling is downlink control information (DCI) signaling.

14. The base station according to claim 11, wherein the DCI signaling is carried by a common search space of a physical downlink control channel (PDCCH), the DCI signaling has a format of format 1C, and a cyclic redundancy check (CRC) code of the DCI signaling scrambles a licensed-assistance access radio network temporary identity (LAA-RNTI).

15. The base station according to claim 11, wherein the indication position preset in the current indication period comprises at least one of the following configurations:

a timing position of a first downlink subframe in the current indication period, wherein the indication signaling correspondingly indicates an uplink subframe in the current indication period; or a timing position of one or more downlink subframes except the first downlink subframe in the current indication period, wherein the indication signaling correspondingly indicates an uplink subframe in the next indication period; or a timing position of one or more downlink subframes in a last frame in the current indication period, wherein the indication signaling correspondingly indicates an uplink subframe in the next indication period; or a timing position of one or more downlink subframes preceding the first uplink subframe in the current indication period, wherein the indication signaling correspondingly indicates an uplink subframe in the current indication period; or a timing position of one or more downlink subframes preceding each uplink subframe in the current indication period, wherein the indication signaling correspondingly indicates an uplink subframe in the current indication period.

16. The base station according to claim 11, wherein the computer-executable instructions when executed by the at least one processor causes the at least one processor to further perform the following operation after acquiring the indication position preset in the current indication period:

notifying the indication position by a radio resource control (RRC) signaling to a terminal, the terminal acquires the indication position by receiving the RRC signaling detects indication signaling at the indication position.

17. The base station according to claim 11, wherein the indication signaling comprises a bit sequence, the number of bits in the bit sequence is the same as the number of subframes in the preset period duration, and positions of 0/1 in the bit sequence respectively correspond to relative timing positions of the uplink subframes in the indication period.

* * * * *